United States Patent [19]

Ferriter et al.

[11] Patent Number: 5,109,337

[45] Date of Patent: Apr. 28, 1992

[54] CONCEPTUAL DESIGN TOOL

[75] Inventors: Kate M. Ferriter, Atlanta, Ga.; Phillip R. Witt, Endicott, N.Y.

[73] Assignee: IBM Corporation, Armonk, N.Y.

[21] Appl. No.: 113,694

[22] Filed: Oct. 28, 1987

[51] Int. Cl.⁵ ............................................. G06F 15/21
[52] U.S. Cl. ............................... 364/401; 364/464.01
[58] Field of Search ... 364/200 MS File, 900 MS File, 364/401, 464.01

[56] References Cited

U.S. PATENT DOCUMENTS 3,343,133  9/1967  Dirks ................................. 364/900

OTHER PUBLICATIONS

Shneiderman, B., "Improving the Human Factors Aspect of Database Interactions", ACM Trans. on Database Systems, vol. 3, No. 4, Dec. 1978, pp. 417-439.
Date, C., *An Introduction to Database Systems*, copyright 1981 by Addison-Wesley Pub. Co., Inc., pp. 407-412.
Hartzband, D. et al., "Enhancing Knowledge Representation in Engineering Databases", *IEEE Computer*, Sep. 1985, pp. 39-48.
Cammarata, S. et al., "An Interactive Data Dictionary Facility for CAD/CAM Data Bases", from *Expert Database Systems*, Kerschberg, L. (ed.), copyright 1986 by Benjamin/Cummings, Pub. Co., Inc., pp. 423-440.

*Primary Examiner*—Stephen M. Baker
*Attorney, Agent, or Firm*—Whitham & Marhoefer

[57] ABSTRACT

A conceptual design tool uses a sketch sheet approach on a computer display to enter the functional design of a product, thereby encouraging the designer to use a top down approach to the design process. The user keys in part descriptions, and the system automatically draws a hierarchical tree structure on the computer display. The user is then prompted to consider, part by part, all of the parts in the product. A series of pop-up menus guide the user through manufacturing and planning for the part. Based on the data input by the user, the system then generates a qualified parts list and computes an estimated cost figure for the product using manufacturing information gathered by the conceptual design tool during product release planning.

5 Claims, 7 Drawing Sheets

```
┌─────────────────────────────────────────────────────────────┐
│ DEFAULT  EXIT              EARLY MANUFACTURING INVOLVEMENT DATA          F1=HELP │
│                                                                          │
│ * DEFAULT VALUES                                                         │
│                                                                          │
│     DETAILS FOR                  BATTERY                                 │
│     ITEM NUMBER                                                          │
│     IN ASSEMBLY                  LAWNMOWER                               │
│     TYPE                                                                 │
│     SOURCE STRATEGY              PURCHASE COMPLETE                       │
│     COMPANY                      SEARS                                   │
│     QUANTITY OF THIS ITEM USED   1                                       │
│     FUNCTION WITHIN PRODUCT      POWER UNIT                              │
│     MATERIAL OF ITEM                                                     │
│     BUILD PROCESS                                                        │
│        LEAD TIMES                                                        │
│     TOOLING                                                              │
│     PROCUREMENT                                                          │
│     COMMODITY TYPE                                                       │
│     COST                                                                 │
│     ITEM CLASSIFICATION                                                  │
│                                                                          │
│ (ENTER) (F1=HELP) (F3=EXIT)                                              │
└─────────────────────────────────────────────────────────────┘
```

FIG. 3

```
┌─────────────────────────────────────────────────────────┐
│ DEFAULT  EXIT                                    F1=HELP│
├─────────────────────────────────────────────────────────┤
│                                                         │
│              EARLY MANUFACTURING INVOLVEMENT DATA       │
│                                                         │
│ * DEFAULT VALUES                                        │
│                                                         │
│      DETAILS FOR                                        │
│      ITEM NUMBER                    BATTERY             │
│      IN ASSEMBLY                    H000             *  │
│      TYPE                           LAWNMOWER           │
│      SOURCE STRATEGY                MAIN ASSEMBLY-Z  *  │
│      COMPANY                        PURCHASE COMPLETE   │
│      QUANTITY OF THIS ITEM USED     SEARS ROEBUCK, INC.*│
│      FUNCTION WITHIN PRODUCT        1                   │
│      MATERIAL OF ITEM               POWER UNIT          │
│      BUILD PROCESS                                      │
│      LEAD TIMES                     ASSEMBLY         *  │
│      TOOLING                        0                ** │
│      PROCUREMENT                    2 WEEKS             │
│      COMMODITY TYPE                                     │
│      COST                           15.00     *         │
│      ITEM CLASSIFICATION            IRS231Z          *  │
│                                                         │
│ [ENTER]  [F1=HELP]  [F3=EXIT]                           │
└─────────────────────────────────────────────────────────┘
```

CONCEPTUAL DESIGN TOOL

BACKGROUND OF THE INVENTION

1. Field of the Invention

The present invention generally relates to a computer based project management system and, more particularly, to a system which uses a top down functional approach to hardware product design which involves creating and exploiting a hierarchical tree view of the product structure early in the design process.

2. Description of the Prior Art

The process of designing, developing and manufacturing a new product, or making major changes to existing products, presents many challenges to product managers and engineers to bring the product to market for the least cost, within schedule while maintaining product quality. In today's highly competitive industries, product managers and engineers require information to address many problems that arise because of the complexity of new products and the complexity of worldwide production and the changing nature of competition. Because new products need to be brought to market in a very short time period to meet the competition, the traditional learning curve formerly associated with product development has disappeared, creating the need to better control product release and determine cost impacts of designs early in the design process.

To meet these needs, many companies are realizing that the conventional product design process is not satisfactory. They require early involvement of manufacturing engineering, cost engineering, logistics planning, procurement, manufacturing and service/support with the design effort. In addition, they require planning and control of product data through design, release and manufacturing.

Project Management, as a modern management tool, has its origins in the early part of this century when Henry L. Gantt, while working for the government during World War I, developed his now famous visual aid for work control. The Gantt chart is a graphic representation of a project schedule that shows each task as a bar having a length proportional to the duration of the task. Later during the 1950s, Dr. John Presper Mauchley, a co-inventor of the EDVAC at the University of Pennsylvania, developed the Critical Path Method (CPM) which was further developed by Willard Frazer, a consultant on the Polaris submarine project. Frazer's contribution was called Program Evaluation and Review Technique (PERT). A PERT chart is one that resembles a flow chart showing predecessor and successor tasks of a project and the critical path.

PERT/CPM models are known and have been used for many years by many large corporations for project management. Such project management tools were first implemented on main frame computers and then on mini computers, equipment which was readily available to large corporations but not to small corporations and firms. More recently, various project management software products have been developed for micro or so-called personal computers. These have made computer based project management tools more economically accessible to small corporations and firms, but their application requires some degree of sophistication on the part of the user. As a result, many small corporations and firms still use manual methods of project management, often relying on an expediter to stay one step ahead in scheduling supplies and work on a day to day basis.

Rupert A. Schmidtberg and Mark A. Yerry in an article entitled "Designing Complex Assemblies Using the Top-Down Approach" published in *Autofact* 1986 *Proceedings*, at pages 9-31 to 9-43, describe a design approach where the engineer first creates the top-most assembly and works downward, filling in of the subordinate subassemblies and parts. In this approach, a hierarchical representation of the design object is built and refined. As a design concept is refined, design constraints are communicated down the hierarchy. Evaluation of the design concept at each level of refinement may cause feedback to be passed up the hierarchy in the form of recommendations for design changes or requests to relax some design constraints.

This top-down design approach has significant advantages over the traditional approach to design of a new product. The Schmidtberg and Yerry implementation, however, is in the environment of a CAD/CAE system which assumes a high degree of computer design sophistication on the part of the user. What is needed is a simpler to use system which takes advantage of the top-down design approach.

SUMMARY OF THE INVENTION

It is therefore an object of this invention to provide an easy to use system which implements a top-down functional approach to hardware product design.

It is another object of the invention to provide a system which integrates a top-down design approach and prompts the new product designer by a graphic display of the product components.

According to the invention, a sketch sheet approach on a computer display is used to enter the functional design of a product. The user needs to key in only part descriptions, and the system automatically draws a hierarchical tree structure on the computer display. The user is then prompted to consider, part by part, all of the parts in the product. A series of menus pop-up and guide the user through manufacturing planning for that part.

The process begins by producing a functional sketch of the product design. This sketch is in the form of a hierarchical tree structure, thereby encouraging the top-down design approach. The system queries the user for component parts of the product, and as the query process progresses, the tree structure is created on the computer screen for the user to view.

Behind each element, or item, in the functional hierarchy of the product, associated engineering design and manufacturing information is gathered. This manufacturing detail is used for product release planning and scheduling, and manufacturing planning, as well as for feasibility level cost estimating. The user has the option at any time during the design process to deal with the proposed product or product components at a high level or at a very detailed level. At any level, manufacturing details which are not known by the user can be defaulted from a relational database using the known item attributes.

The product designer is aided in implementing early manufacturing involvement, or the integration of the design process with manufacturing and other production-related concerns. The designer is prompted to enter manufacturing data for each item in the product structure, thus introducing a third dimension to the hierarchical tree structure. This third dimension serves several purposes. The manufacturing data can be manipulated to produce needed estimates and schedules for the designer. The manufacturing data of interest falls under four categories: (1) information which assists in planning the manufacture of the product, (2) information which assists in producing a cost estimate of the product, (3) information which assists in generating a product release schedule, and (4) information which will assist a CAD/CAM designer or product planner in locating similar items. In the fourth instance, the designer or planner then has the option to use the similar design, avoiding another design effort, or to use the existing design as a template to modify or for other guidance in preparing the new design.

The hierarchical approach implemented by the invention provides a convenient interface to product costing, as early cost estimates will consider only the very high level assemblies and not consider low level detail. As the release plan reaches completion, however, much more detail becomes available and the product cost estimate will roll up the more detailed tree structure to provide a more precise estimate. Cost estimates at the very early development phase of the product help determine product feasibility as well as to direct engineering effort at the most significant portions of the product.

BRIEF DESCRIPTION OF THE DRAWINGS

The invention will be better understood from the following detailed description of a preferred embodiment of the invention with reference to the drawings, in which.

DETAILED DESCRIPTION OF A PREFERRED EMBODIMENT OF THE INVENTION

Figure 1:
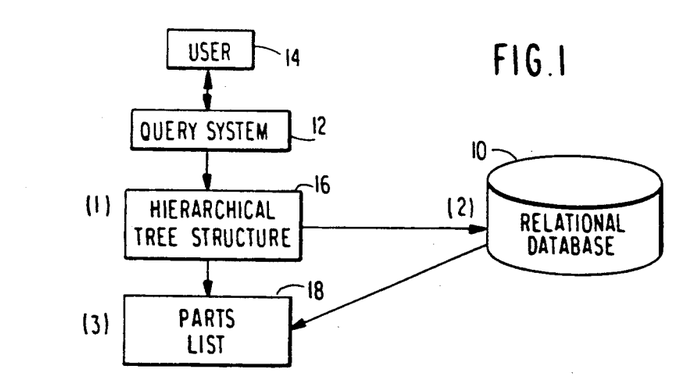
FIG. 1 is a system block diagram showing the functional requirements for implementing the conceptual design tool according to the present invention.

Referring now to the drawings, and more particularly to FIG. 1, there is shown in functional block diagram form the conceptual design tool according to the invention. The key parts of this system are the database 10 and the query system 12. The database 10 could be any of several products currently available, but for purposes of the preferred embodiment, IBM's DATABASE 2 (DB2) is used. DB2 is a relational database management system, but it will be understood by those skilled in the art that other databases, including hierarchical databases, could be used. The query system 12 could be an expert system, but for purposes of the preferred embodiment, IBM's Restructured Extended Executor (REXX) language is used. General information on IBM's DB2 can be had with reference to publication GC26-4073-2 published by IBM Corp. A description of the REXX language is provided in *Virtual Machine/Systems Product, System Product Interpreter User's Guide*, Release 4, publication SC24-5238-2 published by IBM Corp.

The user 14 is first queried on the functional product structure by the query system 12, and in response to the user input, the database 10 captures the structure in a table. The query session begins by prompting the user to input the name of the product. The product might be a new lawnmower, for example, and the user would simply type in "LAWNMOWER". Then the user is able to type in the major components of the product. In the case of the lawnmower, this might be a handle, a grass catcher, a motor cover, a blade, wheels, documentation, electronics, and a battery. These would be individually entered by the user, in no particular order, in response to a prompt to enter the next component or indicate that there are no more major components by entering "END" or by pressing a designated key. Once the major components have been entered by the user, the user enters "END" or presses the END key causing the query system to examine the subcomponents of the major components that have been entered. For example, the query system 12 would prompt the user 14 to enter the components of the handle. These components might be an upper handle assembly with controls and a lower handle assembly which attaches to the lawnmower frame. Again, when all the subcomponents for the handle have been entered, the user enters "END" or presses the END key, causing the query system to next prompt the user to enter the components of the grass catcher, and so on. The process continues until the user has entered all the components of the new product to a level of detail desired, at least for the time being. It should be understood, however, that the user can return to the design session at any time and add more detail and/or change earlier input component data.

Figure 2:
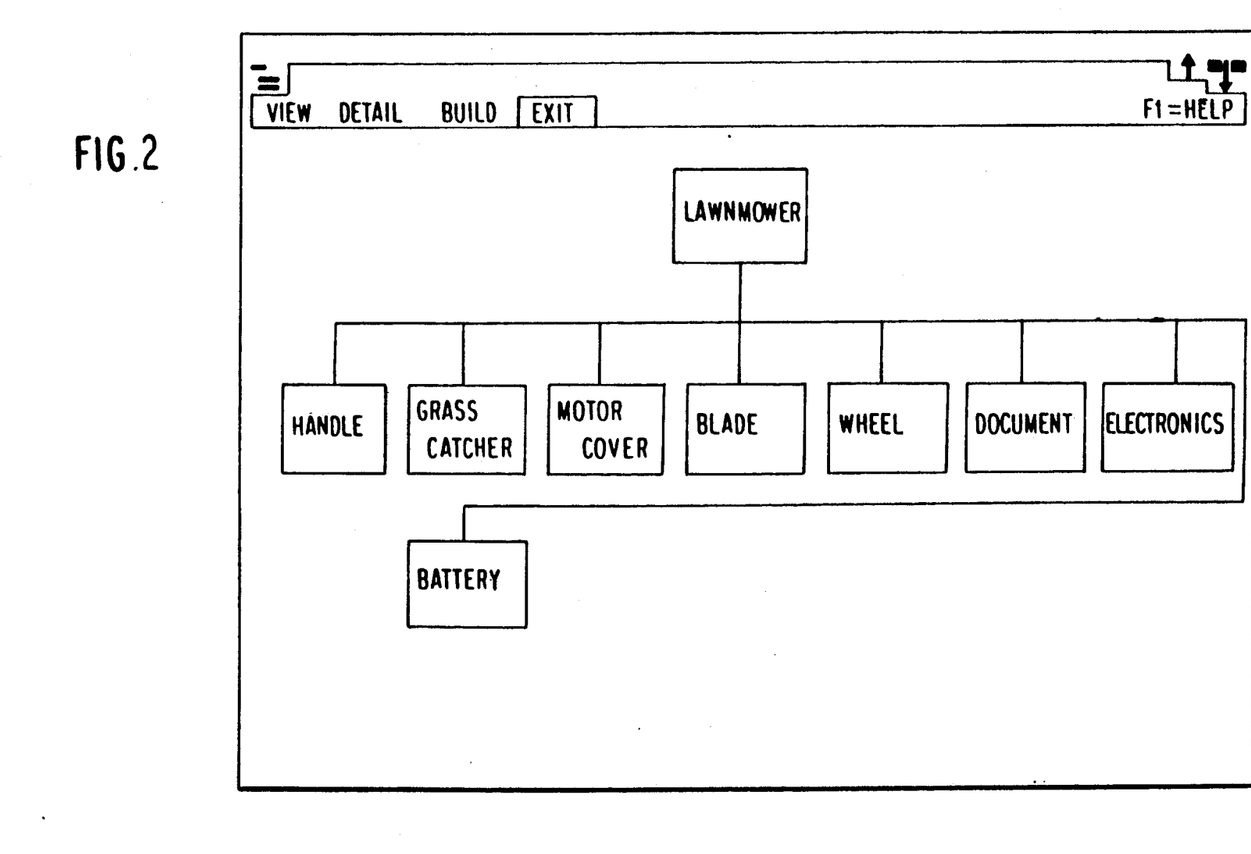
FIG. 2 is a screen illustrating the computer display of a hierarchical tree structure generated by the system for a hypothetical product under design.

As the query session progresses, the components entered by the user 14 are captured in a table of the relational database 10 and a functional hierarchical tree of the structure 16 is generated on the computer screen. For the example described above, this hierarchical tree structure is shown in FIG. 2 of the drawings to the first level of detail of the design. While only two levels are shown, those skilled in the art will understand that, within practical limits, an indefinite number of levels may be generated depending on the product and the level of detail required to define that product. In a specific embodiment of the invention, up to thirty levels of the tree structure are allowed. Experience indicates that this is sufficient for all but the most complex of products. Also, depending on the capabilities of the display system being used, the hierarchical tree structure may be displayed on several successive screens as the level of detail progresses.

To do product costing, a product structure is first created using the hierarchical tree structure. For each item in the product structure, the user must enter known manufacturing information. From this information, cost estimates can be drawn from the database 10. The user inputs a rough estimate on overall product assembly time in hours per unit, as well as a contingency factor, like 15%. The system decomposes the product structure into a parts list 18, and quantity of each part as well as cost per part are pulled from the manufacturing information table in the relational database associated with each item. The cost estimating function then multiplies each part on the list by quantity of that part, then by cost of that part. The results for the parts list are added. The labor estimate is multiplied by the standard hourly labor and burden rate. The results of the parts list multiplication and the labor multiplication are added, and the result is output to the user.

The manufacturing data a user would be interested in would depend on the nature of the business, but some examples are listed below:

1) Function of the item (e.g., fastener, cover, sealant, etc.);
2) Process by which the item is made (e.g., injection molding, casting, grinding, etc.);
3) Material used to make the item (e.g., PVC plastic, aluminum, etc.);
4) Item type (e.g., assembly, detail part, etc.);
5) Cost of the item;
6) Finish type and quality;
7) Weight;
8) Size (e.g., diameter, length, etc.);
9) Technology required to produce the item;
10) Procurement source;
11) Lead time to design the item;
12) Lead time to provide tooling to make the item;
13) Lead time to procure the item; and
14) Lead time to prototype the item.

Figure 3:
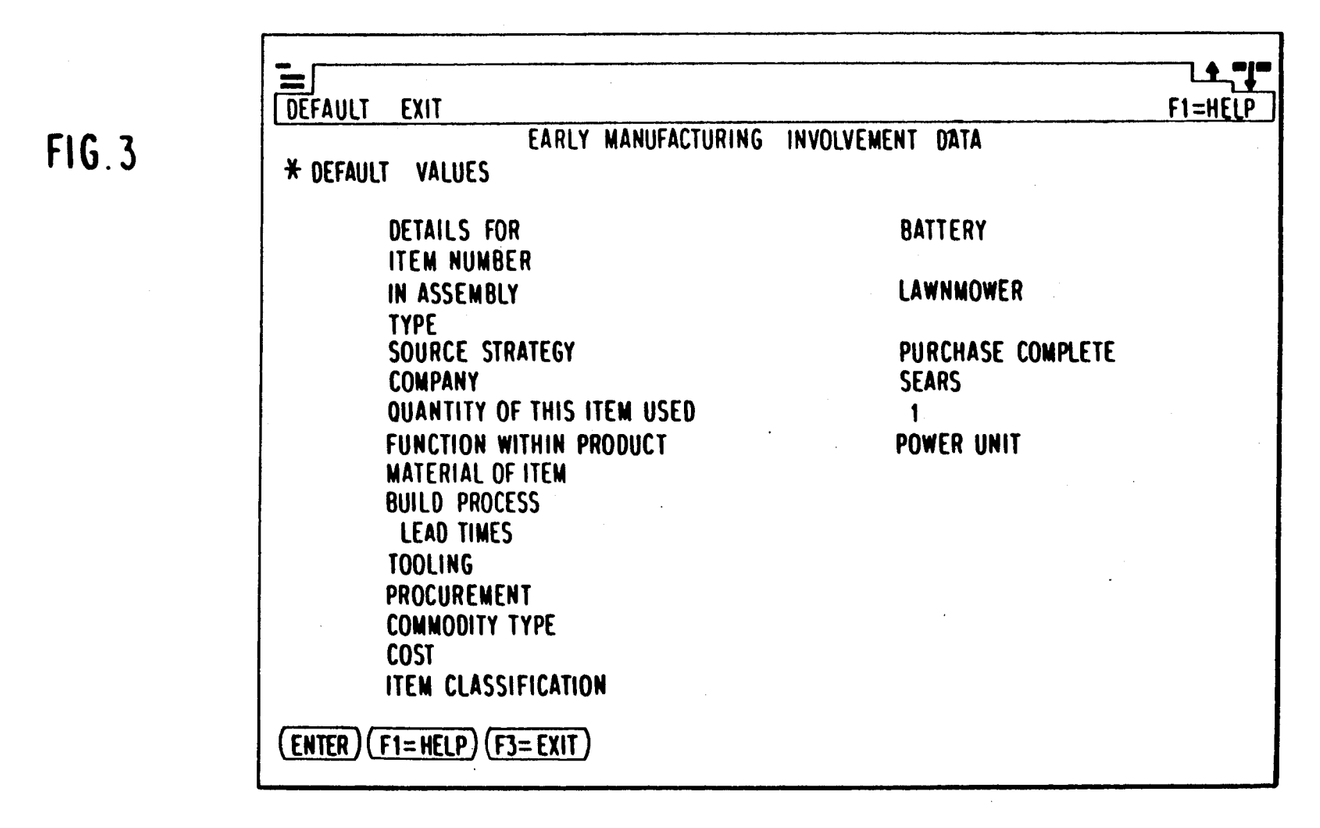
FIG. 3 is a screen illustrating the computer display of early manufacturing involvement data for one component of the structure shown in FIG. 2.
Figure 4:
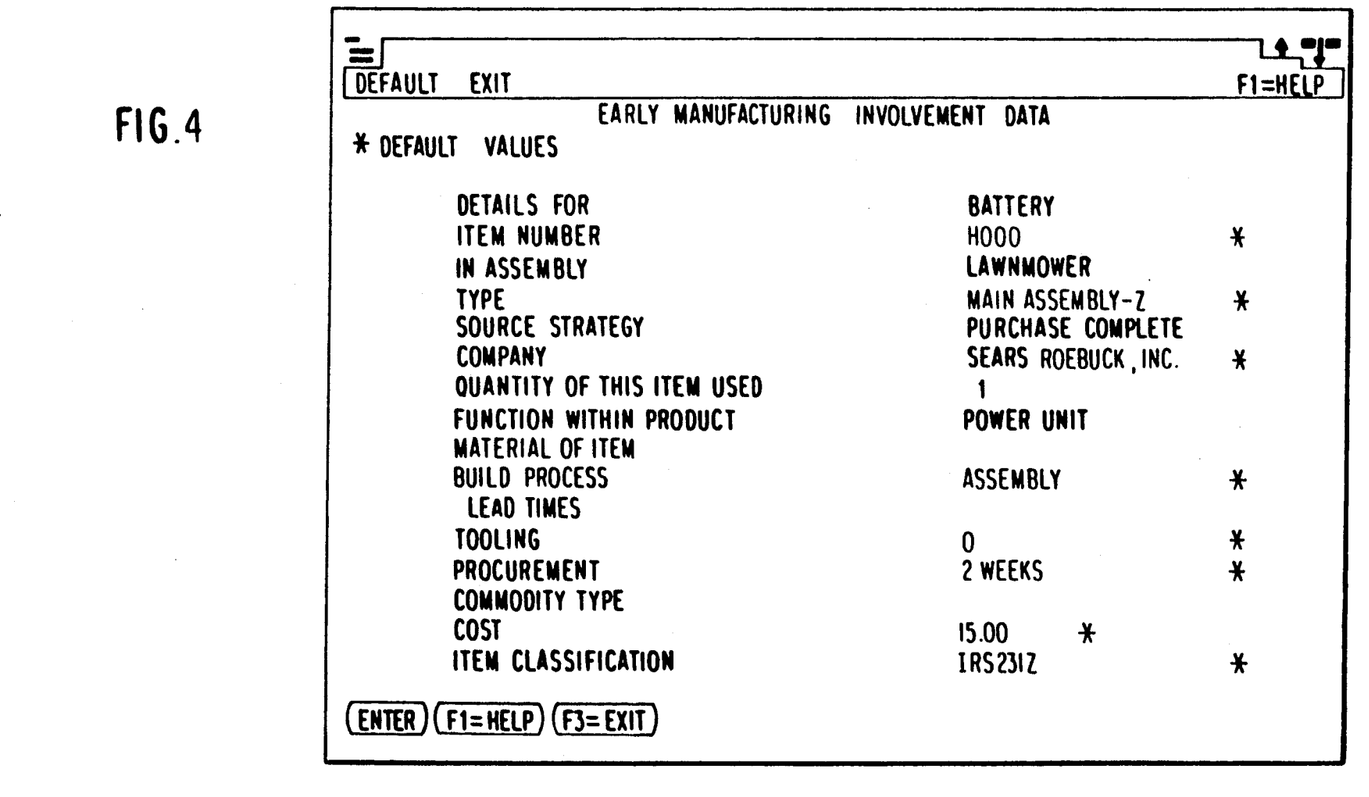
FIG. 4 is a screen illustrating the computer display of early manufacturing involvement data for one component with default data entered by the system.

FIG. 3 shows a screen from a computer display which would appear when the user selects, for example, BATTERY as the object and chooses the action "DETAIL". The design engineer keys in known manufacturing data using this screen. In this example, the designer intends to use an "off the shelf" battery to be purchased complete from Sears. There is one battery in the product structure, and its function is power unit. The user can then choose to have default values supplied from the relational database based on known item attributes. The user selects the action "DEFAULT", and the screen shown in FIG. 4 is displayed. The method by which the relational database can access these defaults is by accessing the table in which the user input data was captured during the query session. More specifically, the attributes in the table are accessed by attribute numbers and these numbers, in turn, are used as an index to access the default attributes for items, these values having been previously stored for similar parts in the database. The screen shown in FIG. 4 displays the resultant default values, marked by an asterisk. The system has generated an item number, A000. From the position of the item within the tree, the system has determined that it is a Main Assembly. The full name of the vendor, Sears Roebuck, Inc., is inserted. The process by which the battery is incorporated into the product is assembly. Tooling leadtime defaults to zero since the item is purchased complete off the shelf. The cost per battery, based on actuals, is $15.00. An item classification, or group technology classification is system generated based on the gathered attributes, function, sourcing strategy and vendor. This item classification code can be used in many production planning functions, including scheduling and procurement.

Figure 5:
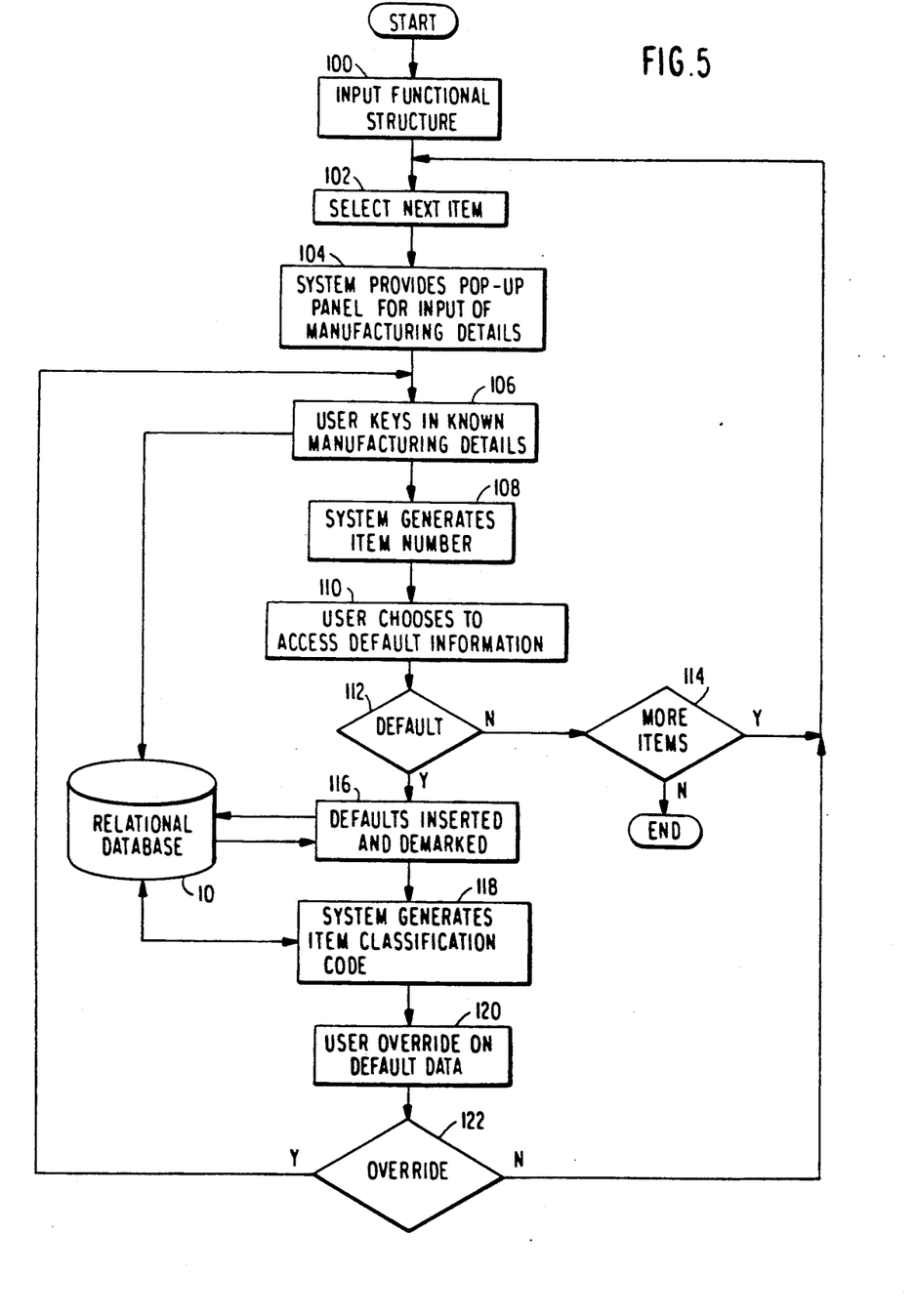
FIG. 5 is a flow chart showing the logic of the conceptual design tool according to the invention implemented in software.

Referring now to FIG. 5, there is shown a flow chart of the logic of the conceptual design tool according to the invention implemented in software. One of ordinary skill in the art can write source code from this flow chart in any suitable computer language, such as BASIC, Pascal or C, for any desired computer system, such as the IBM Personal System (PS) computers which support those computer languages.

The process begins by inputting the functional structure of the product as indicated by function block 100. This is done during the query session as is described in more detail with respect to FIG. 6. Once the functional structure of the product has been input and the hierarchical tree structure has been generated to the current level of detail desired, the user is prompted to select an item in the structure in function block 102. When the user selects an item, the system provides a pop-up panel for manufacturing details in function block 104. This pop-up panel allows the user to key in known manufacturing information in function block 106. When this information has been input by the user, the system generates an item number in function block 108. The system then allows the user to choose to access default information in function block 110. A test is made in decision block 112 to determine if the user has chosen to access default information. If not, a test is next made in decision block 114 to determine if there are more items for which manufacturing details are to be input. If so, then the process loops back to function block 102.

Assuming that the test in decision block 112 is positive, that is, the user chooses to access default information, then in function block 116, the system accesses the default values in database 10 and inserts those values. Then, in function block 118, the system generates an item classification code. The user is given the option of overriding any of the default data in function block 120. A test is made in decision block 122 to determine if the user chooses to override any default data. If so, the system loops back to function block 106 which allows the user to key in known manufacturing data as a typeover of the previously inserted default data; otherwise, the system loops to function block 102 to select the next item in the functional structure of the product. Eventually, the test in decision block 114 will be negative, and the process ends.

Figure 6:
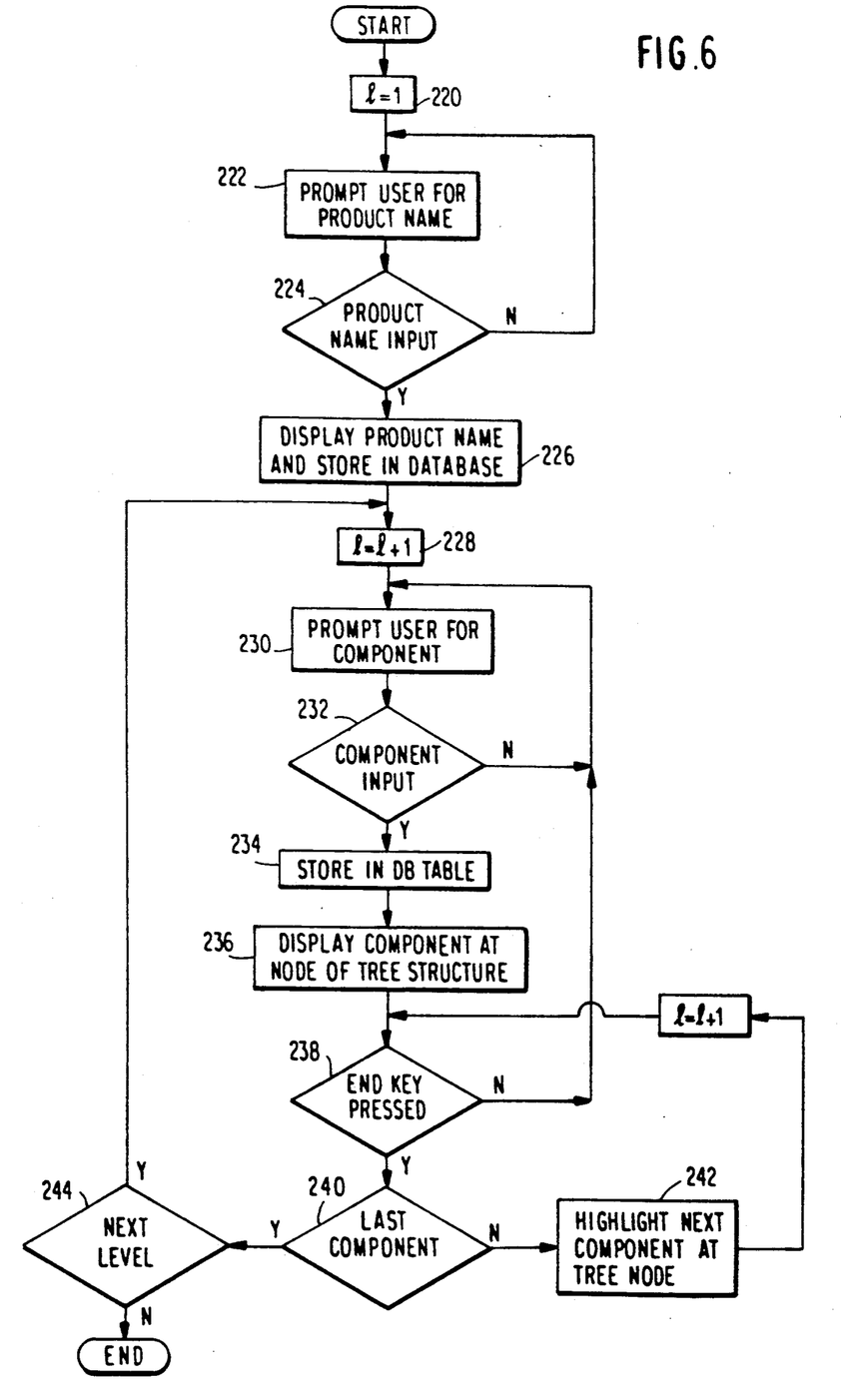
FIG. 6 is a flow chart showing the logic of the query session during which a relational data base table is built.

FIG. 6 show in flow chart form the logic of the query system according to the invention. This flow chart in combination with a dialog system, such as IBM's REXX language, and a database system, such as IBM's DB2, is sufficient for a programmer of ordinary skill in the art to write the required code to implement the query system. With specific reference to FIG. 6, the process begins by setting l=1 at block 220, where l is the product or component level. Then, at function block 222 the user of the system is prompted for the product name. In the example given, the name would be "LAWNMOWER". The system waits for a user input at decision block 224, and when the product name has been input, the system opens a file in the database with the product name and displays the product name on a computer screen in function block 226. In block 228, l is set to l+1 indicating the next level of components, and the system then prompts the user in function block 230 for the components of the product at this level. Each time the user inputs a component as detected by decision block 232, the inputted component is stored in the database for that level in function block 234, and the system displays the inputted component on the computer screen at a node of the tree structure in function block 236. The system will continue to prompt the user for components after each component is entered by the user until the user enters "END" or presses the END key which signals an end to the list of components for this level. Thus, the system tests the user input in decision block 238 for the entry of "END" or the pressing of the END key. If that input is not detected, then the system waits for the next user input in decision block 232, and when an input is received, the component is stored in the database table in function block 234 and so forth.

Once all the components have been input by the user for a given level as indicated by entering "END" or pressing the END key, the system then determines in decision block 240 if the last component in the current level has had components input by the user. If not, the next component in the current level is highlighted in the displayed tree structure, and the system loops back to function block 230 where the user is again prompted for components of this component. On the other hand, if the last component of the current level has had components inputted by the user as detected in decision block 240, the system tests for a user input in decision block 244 to determine if components are to be entered for the next level. This is accomplished by the user pressing a Y key or an N key when prompted for the next level. If the Y key is pressed indicating that the user now wants to input the next level of components, the system loops back to block 228 to index to the next level. If on the other hand, the N key is pressed indicating that the user does not at this time wish to input the next level of components or that there is no next level of components to enter, the query process ends.

Figure 7:
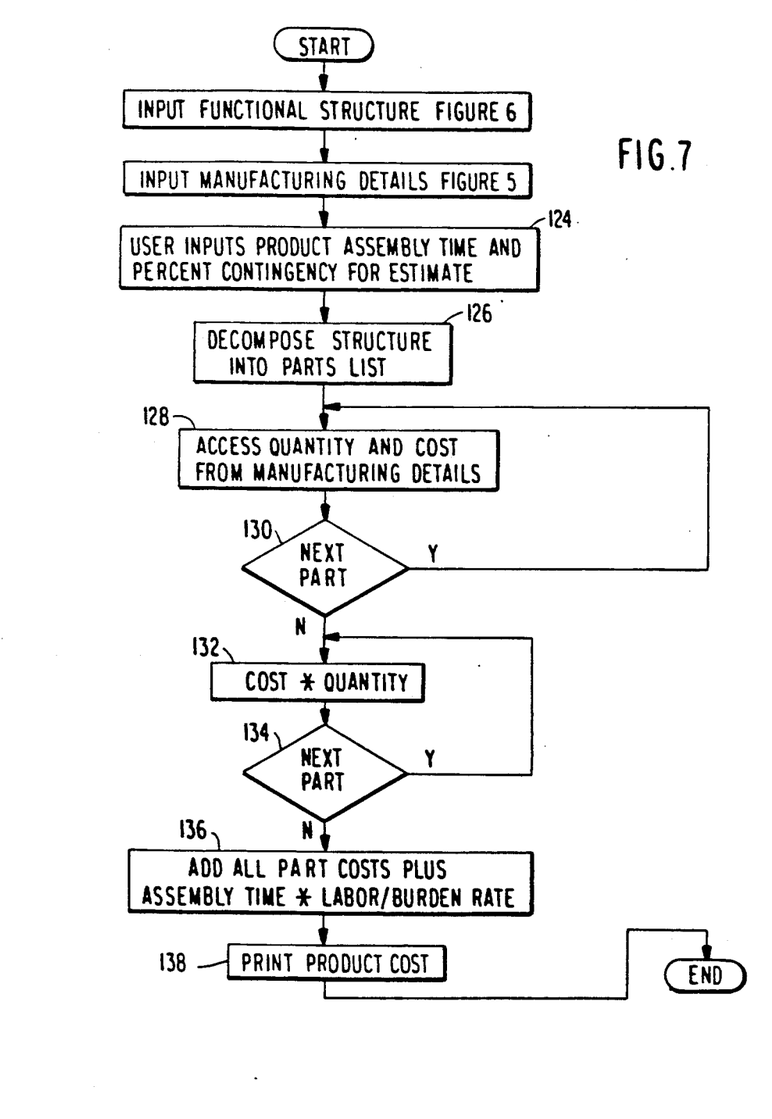
FIG. 7 is a flow chart showing the logic of the product costing using the conceptual design tool according to the invention.

Product costing using the conceptual design tool according to the invention is illustrated by the flow chart shown in FIG. 7. The process begins at a point where both the functional structure (FIG. 6) and the manufacturing details (FIG. 5) have been input. In function block 124, the user is prompted to input product assembly time and percent contingency for estimating purposes. When this data has been input by the user, the system decomposes the structure into a parts list in function block 126. The manner in which this is done is detailed in FIG. 8. The system then generates the quantity and cost of the part from the manufacturing details in function block 128 and repeats this process for each part in block 130. When all parts have been processed for quantity and cost, the cost and quantity for each part are multiplied in function blocks 132 and 134 to arrive at a series of cost figures for all parts in the product. These cost figures are summed in function block 136 together with a cost figure which is the product of assembly time multiplied by the sum of the labor and burden rates. This estimated cost figure is then output to the user by printing, for example, in function block 138, and the process ends. The printout of the cost data includes not only the final estimated product cost but also the data from which that estimated cost is derived.

Figure 8:
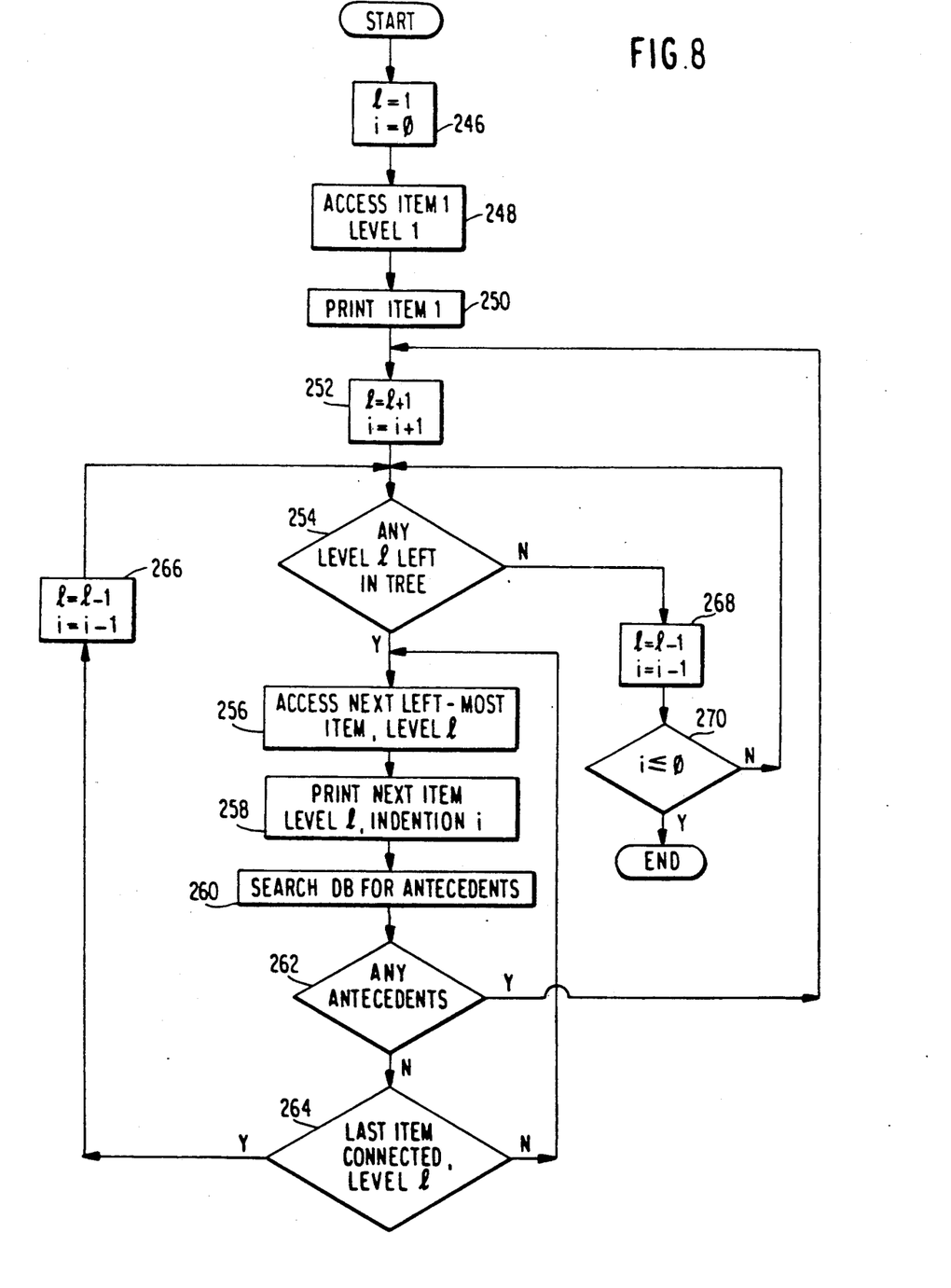
FIG. 8 is a flow chart showing the logic of the generation of a parts list in the form of an indented bill of materials.

Turning now to the flow chart of FIG. 8, the parts list in function block 126 is automatically generated as an indented bill of materials from the table in the database which was built during the query session. Again, this flow chart shows the logic of the automatic generation of an indented bill of materials, and any programmer skilled in the art with an understanding of database systems, such as the IBM DB2 database, can write code to implement the invention from the logic of the flow chart. The process begins in FIG. 8 by setting l=1 and i=0 in block 246, where is the component level as before and i is the indentation of the bill of materials. Next, item 1 of level l is accessed in function block 248. In the example given, this item is the product name "LAWNMOWER". Item 1 is then printed in function block 250, and l and i are then indexed by adding 1 to each. A test is then made in decision block 254 to determine if any level l is left in the tree. If so, the system accesses the next left-most item in the tree of the current level in function block 256. The accessed item is then printed in function block 258 with indentation i. A search is then made of the database in function block 260 for antecedents. If any are found in decision block 262, the system loops back to block 252 where the level and indentation are indexed by one. Otherwise, a test is made in decision block 264 to determine if the last item of the current level has been connected. If so, the level and the indentation are indexed backward in block 266 by subtracting one from each. The process then returns to decision block 254 to continue the process of accessing and printing items in order. When the test in decision block 254 becomes negative, that is there are no levels l left in the tree structure, the level and indentation are again indexed backward by subtracting one in block 268. A test is then made in decision block 270 to determine if the indentation i is less than or equal to zero. If not, the process loops back to decision block 254; otherwise, the indented bill of materials is complete and the process ends.

From the foregoing, it will be appreciated that the conceptual design tool according to the invention provides an easy to use system which implements a top-down functional approach to hardware product design. The system encourages early manufacturing involvement to develop the information needed to aid and improve the total design and manufacturing effort needed to produce the final product.

While the invention has been described in terms of a preferred embodiment, those skilled in the art will recognize that the invention can be practiced with modification and alteration within the spirit and scope of the appended claims.

Having thus described our invention, what we claim as new and desire to secure by letters patent is as follows:

1. A conceptual design tool method for implementation on a computer, said conceptual design tool method providing for the early manufacturing involvement information needed to aid and improve the total design planning and manufacturing effort to product a final product, comprising the steps of:

prompting a user on a functional product structure;

capturing product structure data input by the user in a database by entering components for each level of component detail in a table in the database;

generating a hierarchical structure of the product structure and displaying said hierarchical structure to the user as the product structure data is captured in the database;

prompting the user to input manufacturing details for each item in the functional product structure by selecting an item in the structure and displaying a screen for input of manufacturing details;

providing the user with an option to enter default manufacturing information of each item;

accessing a database to insert default manufacturing information in said screen from said database for similar items;

providing the user with an option to override default manufacturing information inserted in said screen;

accepting user manufacturing information input to said screen in place of the default manufacturing information;

generating an item number for each item and storing the manufacturing information input to said screen in a database indexed by said item number;

generating a parts list from the manufacturing details for each item in the functional product structure by accessing each item of each level in the table of the database;

prompting the user to input product assembly time; and computing an estimated cost of the product based on the parts list and user input product assembly time.

2. The conceptual design tool recited in claim 1 wherein the step of computing an estimated cost comprises the steps of:

using the parts list, accessing quantity and cost for each item in the manufacturing information stored in the database;

multiplying the cost by the quantity accessed from the database for each item and temporarily storing the product;

multiplying the product assembly time by a predefined labor and burden cost and temporarily storing the product; and summing the temporarily stored products and providing an output of the estimated cost of the final product under design based on the manufacturing information currently in the database.

3. A conceptual design tool method for implementation on a computer, said conceptual design tool method implementing a top-down functional approach to hardware product design, comprising the steps of:

prompting a user at the beginning of a design process to input a product name for a product to be designed;

capturing a product name input by the user in a database;

thereafter prompting a user to input a functional product structure of the product;

capturing functional product structure data input by the user in said data base under said product name;

generating a hierarchical structure of the product structure as the product structure is captured in the database;

displaying said hierarchical structure to the user as it is generated;

successively selecting items in the hierarchical structure;

prompting the user to input manufacturing details for each item selected on a display screen;

providing the user with an option to enter on said display screen default manufacturing information from said database for each selected item;

accessing said database to insert on said display screen default manufacturing information for similar items stored in said database;

providing the user with an option to override default manufacturing information inserted on said display screen from said database;

accepting user manufacturing information input on said display screen in place of said default manufacturing information;

receiving manufacturing information input on said display screen for each item selected; and generating an item number for each item and storing the manufacturing information in said database indexed by said item number.

4. The conceptual design tool recited in claim 3 further comprising the step of generating a parts list from the manufacturing details for each item in the functional product structure.

5. The conceptual design tool recited in claim 4 further comprising the step of:

using the parts list, accessing quantity and cost for each item in the manufacturing data stored in the database;

multiplying the cost by the quantity accessed from the database for each item and temporarily storing the product;

multiplying the product assembly time by a predefined labor and burden cost and temporarily storing the product; and summing the temporarily stored products and providing an output of the estimated cost of the final product under design based on the manufacturing information currently in the database.

* * * * *